US009324272B2

(12) United States Patent
Liu

(10) Patent No.: US 9,324,272 B2
(45) Date of Patent: Apr. 26, 2016

(54) GOA CIRCUIT, DISPLAY SUBSTRATE AND DISPLAY DEVICE

(71) Applicant: BOE TECHNOLOGY GROUP CO., LTD., Beijing (CN)

(72) Inventor: Libin Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 16 days.

(21) Appl. No.: 14/476,130

(22) Filed: Sep. 3, 2014

(65) Prior Publication Data

US 2015/0339981 A1 Nov. 26, 2015

(30) Foreign Application Priority Data

May 26, 2014 (CN) .......................... 2014 1 0225983

(51) Int. Cl.
*G09G 3/32* (2006.01)

(52) U.S. Cl.
CPC ............ *G09G 3/3266* (2013.01); *G09G 3/3225* (2013.01); *G09G 2300/0819* (2013.01); *G09G 2310/062* (2013.01); *G09G 2310/08* (2013.01); *G09G 2330/04* (2013.01)

(58) Field of Classification Search
CPC ................ G09G 2300/0819; G09G 2310/062; G09G 2310/08; G09G 2330/04; G09G 3/3225; G09G 3/3266
USPC .................................. 345/212–213, 419, 690
See application file for complete search history.

(56) References Cited

U.S. PATENT DOCUMENTS

| | | | |
|---|---|---|---|
| 2006/0221042 A1* | 10/2006 | Cho ........................ | G09G 3/20 345/100 |
| 2007/0063950 A1* | 3/2007 | Shin ....................... | G11C 19/28 345/92 |
| 2008/0084408 A1 | 4/2008 | Nishimura | |
| 2010/0150302 A1* | 6/2010 | Tsai ........................ | G11C 19/28 377/79 |
| 2011/0193892 A1* | 8/2011 | Eom ..................... | G09G 3/3266 345/690 |
| 2012/0050234 A1* | 3/2012 | Jang ..................... | G09G 3/3225 345/204 |
| 2012/0098826 A1* | 4/2012 | Lee ........................ | G09G 3/003 345/419 |
| 2012/0105397 A1* | 5/2012 | Tan ...................... | G09G 3/3677 345/205 |
| 2012/0169574 A1* | 7/2012 | Kim ..................... | G09G 3/3233 345/76 |
| 2012/0327131 A1* | 12/2012 | Jang ..................... | G09G 3/3266 345/690 |
| 2013/0235004 A1* | 9/2013 | Jang ..................... | G09G 3/3275 345/204 |
| 2014/0152629 A1* | 6/2014 | So .......................... | G11C 19/28 345/205 |
| 2014/0152935 A1* | 6/2014 | Heo ....................... | G02F 1/1339 349/43 |
| 2014/0176521 A1* | 6/2014 | Park ..................... | G09G 3/3655 345/211 |

FOREIGN PATENT DOCUMENTS

| | | |
|---|---|---|
| CN | 102467890 A | 5/2012 |
| CN | 103000151 A | 3/2013 |
| CN | 103137067 A | 6/2013 |
| CN | 103208251 A | 7/2013 |

OTHER PUBLICATIONS

First Office Action regarding Chinese application No. 201410225983.9, dated Dec. 21, 2015. Translation provided by Dragon Intellectual Property Law Firm.

* cited by examiner

*Primary Examiner* — Quan-Zhen Wang
*Assistant Examiner* — Tony Davis
(74) *Attorney, Agent, or Firm* — Harness, Dickey & Pierce, P.L.C.

(57) ABSTRACT

A Gate Driver on Array (GOA) circuit according to this disclosure may include M cascaded GOA units. The M GOA units may have a one-to-one correspondence with M rows of pixels within a pixel region. And a Gate signal and a Reset signal may be outputted from each GOA unit. A Gate signal output from a GOA unit in an n-th row may be an input signal of a GOA unit in an (n+1)-th, where n is a natural number less than M.

14 Claims, 4 Drawing Sheets

GOA CIRCUIT, DISPLAY SUBSTRATE AND DISPLAY DEVICE

CROSS-REFERENCE TO RELATED APPLICATION

This application claims the benefit of Chinese patent application No. 201410225983.9 and filed in China on May 26, 2014, which is hereby incorporated by reference in its entirety.

TECHNICAL FIELD

The disclosure relates to the field of display technology, and particularly to a Gate Driver on Array (GOA) circuit, a display substrate and a display device.

BACKGROUND

In the Gate Driver on Array (GOA) technology for a display substrate as a representative of the new technology, a Gate switch circuit is integrated onto the display substrate to save gate driver integrated circuit, thus saving materials and decreasing process steps, and reducing product cost.

The GOA circuit has multiple GOA units, and each GOA unit has a non-inverted phase clock signal input terminal CLK, an inverted phase clock signal input terminal CLKB and a low-voltage signal input terminal VSS. Also, each GOA unit also has an input terminal, a Gate signal output terminal and a Reset signal output terminal. As shown in FIG. 1, the GOA unit in each row includes a Reset signal output module and a Gate signal output module. An input of the GOA unit in each row is an input of the Reset signal output module in the same row, and an output of the Reset signal output module is an input of the Gate signal output module at the same row and an input of a GOA unit in a next row. Furthermore, a GOA unit in the first row employs a Start Vertical (STV) signal as an input.

In a case that VDD-GND is short-circuited due to some reasons within a pixel region (AA region) of a pixel circuit, the short circuit will have an influence on the output of the Reset signal output module in a conventional two-stage structure of the GOA, which results in that an error occurs in the Reset signal. Since the Reset signal is an input of a GOA unit in a next row, an error occurs in an input of the GOA unit in the next row, therefore a multi-row output phenomenon occurs in subsequent GOA units, which results in that display of a display panel is uncontrolled.

SUMMARY

A technical problem to be solved in the disclosure is to provide a GOA circuit, a display substrate and a display device, to reduce an influence of the short circuit of the VDD-GND within the pixel region on the GOA circuit.

In order to solve the technical problem described above, the embodiments of the disclosure provide the following technical solutions.

In an aspect, a GOA circuit is provided, which includes M cascaded GOA units, the M GOA units have a one-to-one correspondence with M rows of pixels within a pixel region, each GOA unit outputs a Gate signal and a Reset signal, a Gate signal output from a GOA unit in an n-th row is an input signal of a GOA unit in an (n+1)-th row, where n is a natural number less than M.

Further, an input signal of a GOA unit in a first row may be a Start Vertical (STV) signal.

Further, a Reset signal output from the GOA unit in the n-th row may be connected to an input terminal of a Reset signal of a pixel in the n-th row, and a Gate signal output from the GOA unit in the (n+1)-th row is connected to an input terminal of a Gate signal of a pixel in the n-th row.

Further, the GOA unit may include:
a Reset signal output module configured to receive an input signal of the GOA unit and output a Reset signal; and
a Gate signal output module configured to receive an input signal of the GOA unit and output a Gate signal,
wherein an output terminal of a Gate signal output module of the GOA unit in the n-th row is connected to an input terminal of the GOA unit in the (n+1)-th row.

Furthermore, the Reset signal output module includes a first clock signal input terminal CLK1, a second clock signal input terminal CLK2, a third clock signal input terminal CLK3, a signal input terminal and a Reset signal output terminal, and further includes a first thin film transistor, a second thin film transistor, a third thin film transistor, a fourth thin film transistor, a fifth thin film transistor and a sixth thin film transistor.

Specifically, a gate electrode of the first thin film transistor may be connected to a drain electrode of the fifth thin film transistor, a source electrode of the first thin film transistor may be connected to the CLK2, and a drain electrode of the first thin film transistor may be connected to the Reset signal output terminal so as to output a Reset signal to outside, a first capacitor may be connected between the gate electrode and the drain electrode of the first thin film transistor.

A gate electrode of the second thin film transistor may be connected to a high level via a second capacitor, and a gate electrode of the second thin film transistor may be connected to a drain electrode of the third thin film transistor, a source electrode of the second thin film transistor may be connected to the high level, and a drain electrode of the second thin film transistor may be connected to the Reset signal output terminal so as to output a Reset signal to outside.

A gate electrode of the third thin film transistor may be connected to the CLK3, a source electrode of the third thin film transistor may be connected to a low level, and a drain electrode of the third thin film transistor may be connected to a drain electrode of the fourth thin film transistor.

A gate electrode of the fourth thin film transistor may be connected to the signal input terminal, a source electrode of the fourth thin film transistor may be connected to the high level, and a drain electrode of the fourth thin film transistor may be connected to the drain electrode of the third thin film transistor.

A gate electrode of the fifth thin film transistor may be connected to the CLK1, a source electrode of the fifth thin film transistor may be connected to the signal input terminal, a drain electrode of the fifth thin film transistor may be connected to the gate electrode of the first thin film transistor, and the drain electrode of the fifth thin film transistor may be connected to a drain electrode of the sixth thin film transistor.

A gate electrode of the sixth thin film transistor may be connected to the high level via the second capacitor, and the gate electrode of the sixth thin film transistor may be connected to the drain electrode of the third thin film transistor, a source electrode of the sixth thin film transistor may be connected to the high level, and a drain electrode of the sixth thin film transistor may be connected to the drain electrode of the fifth thin film transistor.

Furthermore, the Gate signal output module may include a first clock signal input terminal CLK1, a second clock signal input terminal CLK2, a third clock signal input terminal CLK3, a signal input terminal and a Gate signal output terminal, and further includes a seventh thin film transistor, an eighth thin film transistor, a ninth thin film transistor, a tenth thin film transistor, an eleventh thin film transistor and a twelfth thin film transistor.

Specifically, a gate electrode of the seventh thin film transistor may be connected to the CLK1, a source electrode of the seventh thin film transistor may be connected to the CLK2, a drain electrode of the seventh thin film transistor may be connected to the Gate signal output terminal so as to output a Gate signal to outside.

A gate electrode of the eighth thin film transistor may be connected to the CLK1, a source electrode of the eighth thin film transistor may be connected to the Gate signal output terminal, and a drain electrode of the eighth thin film transistor may be connected to the CLK2.

A gate electrode of the ninth thin film transistor may be connected to the CLK1, a source electrode of the ninth thin film transistor may be connected to the Gate signal output terminal, and a drain electrode of the ninth thin film transistor may be connected to the CLK2.

A gate electrode of the tenth thin film transistor may be connected to the CLK1, a source electrode of the tenth thin film transistor may be connected to the Gate signal output terminal, and a drain electrode of the tenth thin film transistor may be connected to the CLK2.

A gate electrode of the eleventh thin film transistor may be connected to the CLK1, a source electrode of the eleventh thin film transistor may be connected to the Gate signal output terminal, and a drain electrode of the eleventh thin film transistor may be connected to the CLK2.

A gate electrode of the twelfth thin film transistor may be connected to the CLK1, a source electrode of the twelfth thin film transistor may be connected to the Gate signal output terminal, and a drain electrode of the twelfth thin film transistor may be connected to the CLK2.

The embodiments of the disclosure further provide a display substrate including the GOA circuit as described above.

The embodiments of the disclosure further provide a display device including the display substrate as described above.

The embodiments of the disclosure have the following advantageous effects.

In the solutions described above, a layout structure of the GOA circuit is changed, a Gate signal output from a GOA unit in each row is an input signal of the GOA unit in a next row. In this way, a Reset signal output from the GOA unit in each row is no more the input signal of the GOA unit in a next row. Even though an error occurs in the Reset signal output from a GOA unit in a certain row due to the short circuit of the VDD-GND within the pixel region, an output of a GOA unit in a next row will not be influenced, which reduces the influence of the short circuit of the VDD-GND on the output of the GOA circuit. In addition, since a Gate signal output from a GOA unit in a previous row is an input signal of a GOA unit in a next row, which enables signal transmission capacity of the GOA circuit to be enhanced.

DETAILED DESCRIPTION

Figure 1:
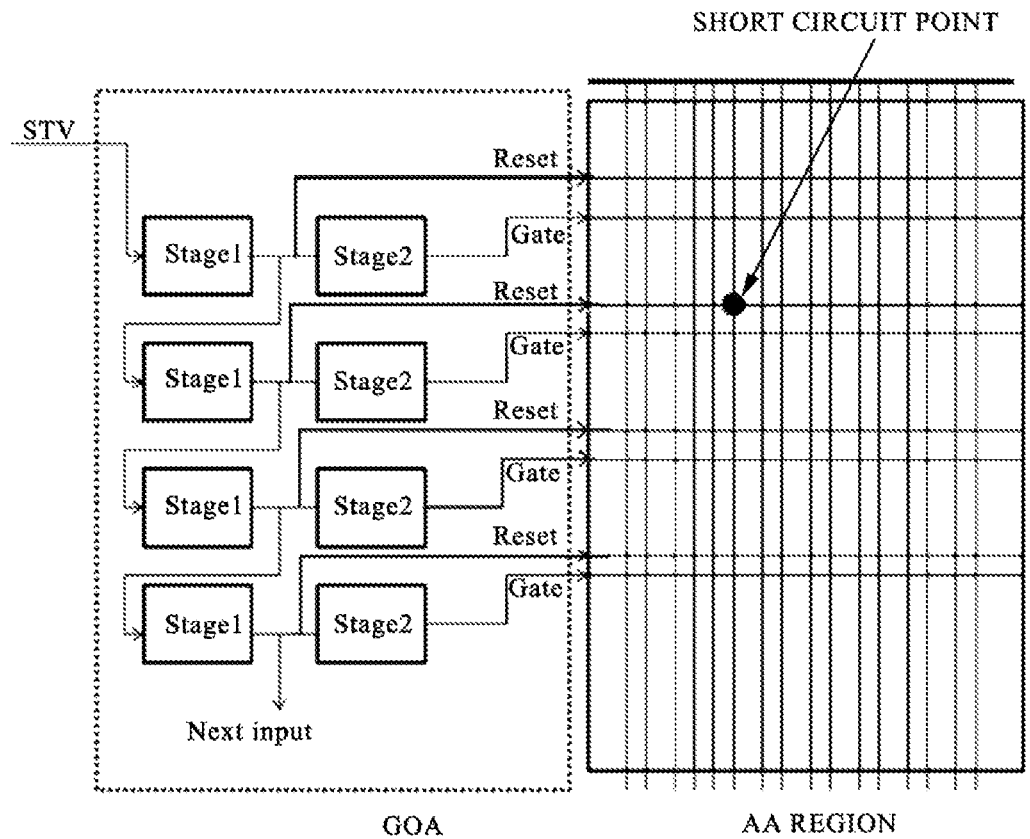
FIG. 1 is a schematic structural diagram of a GOA circuit in the prior art.

In order to make the technical problem to be solved, the technical solutions and advantages of the embodiments of the disclosure clearer, the disclosure is described below in conjunction with drawings and specific embodiments.

The embodiments of the disclosure aim to solve the following problem in the prior art, i.e., when the VDD-GND is short-circuited in the pixel circuit within the pixel region, an error occurs in an output of Reset signal and therefore an error occurs in an input of a GOA unit in a next row, so that a multi-row output phenomenon occurs in the subsequent GOA units, which results in that display of the display panel is uncontrolled. The embodiments of the disclosure provide a GOA circuit, a display substrate and a display device, to reduce an influence of the short circuit of the VDD-GND within the pixel region on the GOA circuit.

A GOA circuit in the disclosure includes M cascaded GOA units, the M GOA units have a one-to-one correspondence with M rows of pixels within a pixel region, a Gate signal and a Reset signal are output from each GOA unit, and a Gate signal output from a GOA unit in an n-th row is an input signal of a GOA unit in an (n+1)-th row, where n is a natural number less than M.

In the GOA circuit according to the disclosure, a Gate signal output from a GOA unit in each row is an input signal of the GOA unit in a next row. In this way, a Reset signal output from the GOA unit in each row is no more the input signal of the GOA unit in a next row. Even though an error occurs in the Reset signal output from a GOA unit in a certain row due to the short circuit of the VDD-GND within the pixel region, an output of a GOA unit in a next row will not be influenced, which reduces the influence of the short circuit of the VDD-GND on the output of the GOA circuit. In addition, since a Gate signal output from a GOA unit in a previous row is an input signal of a GOA unit in a next row, which enables signal transmission capacity of the GOA circuit to be enhanced.

Specifically, an input signal of a GOA unit in a first row is a Start Vertical (STV) signal. A Reset signal output from the GOA unit in the n-th row is connected to an input terminal of a Reset signal of a pixel in the n-th row, and a Gate signal output from the GOA unit in the (n+1)-th row is connected to an input terminal of a Gate signal of the pixel in the n-th row.

Specifically, the GOA unit includes:
a Reset signal output module configured to receive an input signal of the GOA unit and output a Reset signal; and
a Gate signal output module configured to receive an input signal of the GOA unit and output a Gate signal,
wherein an output terminal of a Gate signal output module of the GOA unit in the n-th row is connected to an input terminal of the GOA unit in the (n+1)-th row.

Furthermore, the Reset signal output module includes a first clock signal input terminal CLK1, a second clock signal input terminal CLK2, a third clock signal input terminal CLK3, a signal input terminal and a Reset signal output terminal, and further includes a first thin film transistor, a second thin film transistor, a third thin film transistor, a fourth thin film transistor, a fifth thin film transistor and a sixth thin film transistor.

Specifically, a gate electrode of the first thin film transistor is connected to a drain electrode of the fifth thin film transistor, a source electrode of the first thin film transistor is connected to the CLK2, and a drain electrode of the first thin film transistor is connected to the Reset signal output terminal so as to output a Reset signal to outside, a first capacitor is connected between the gate electrode and the drain electrode of the first thin film transistor.

A gate electrode of the second thin film transistor is connected to a high level via a second capacitor, and a gate electrode of the second thin film transistor is connected to a drain electrode of the third thin film transistor, a source electrode of the second thin film transistor is connected to the high level, and a drain electrode of the second thin film transistor is connected to the Reset signal output terminal so as to output a Reset signal to outside.

A gate electrode of the third thin film transistor is connected to the CLK3, a source electrode of the third thin film transistor is connected to a low level, and a drain electrode of the third thin film transistor is connected to a drain electrode of the fourth thin film transistor.

A gate electrode of the fourth thin film transistor is connected to the signal input terminal, a source electrode of the fourth thin film transistor is connected to the high level, and a drain electrode of the fourth thin film transistor is connected to the drain electrode of the third thin film transistor.

A gate electrode of the fifth thin film transistor is connected to the CLK1, a source electrode of the fifth thin film transistor is connected to the signal input terminal, a drain electrode of the fifth thin film transistor is connected to the gate electrode of the first thin film transistor, and the drain electrode of the fifth thin film transistor is connected to a drain electrode of the sixth thin film transistor.

A gate electrode of the sixth thin film transistor is connected to the high level via the second capacitor, and the gate electrode of the sixth thin film transistor is connected to the drain electrode of the third thin film transistor, a source electrode of the sixth thin film transistor is connected to the high level, and a drain electrode of the sixth thin film transistor is connected to the drain electrode of the fifth thin film transistor.

Furthermore, the Gate signal output module includes a first clock signal input terminal CLK1, a second clock signal input terminal CLK2, a third clock signal input terminal CLK3, a signal input terminal and a Gate signal output terminal, and further includes a seventh thin film transistor, an eighth thin film transistor, a ninth thin film transistor, a tenth thin film transistor, an eleventh thin film transistor and a twelfth thin film transistor.

Specifically, a gate electrode of the seventh thin film transistor is connected to the CLK1, a source electrode of the seventh thin film transistor is connected to the CLK2, a drain electrode of the seventh thin film transistor is connected to the Gate signal output terminal so as to output a Gate signal to outside.

A gate electrode of the eighth thin film transistor is connected to the CLK1, a source electrode of the eighth thin film transistor is connected to the Gate signal output terminal, and a drain electrode of the eighth thin film transistor is connected to the CLK2.

A gate electrode of the ninth thin film transistor is connected to the CLK1, a source electrode of the ninth thin film transistor is connected to the Gate signal output terminal, and a drain electrode of the ninth thin film transistor is connected to the CLK2.

A gate electrode of the tenth thin film transistor is connected to the CLK1, a source electrode of the tenth thin film transistor is connected to the Gate signal output terminal, and a drain electrode of the tenth thin film transistor is connected to the CLK2.

A gate electrode of the eleventh thin film transistor is connected to the CLK1, a source electrode of the eleventh thin film transistor is connected to the Gate signal output terminal, and a drain electrode of the eleventh thin film transistor is connected to the CLK2.

A gate electrode of the twelfth thin film transistor is connected to the CLK1, a source electrode of the twelfth thin film transistor is connected to the Gate signal output terminal, and a drain electrode of the twelfth thin film transistor is connected to the CLK2.

The embodiments of the disclosure further provide a display substrate including the GOA circuit described above, the display substrate further includes multiple rows of pixels, each row of pixels is used to receive a Gate signal and a Reset signal output from a GOA unit corresponding to the row of pixels.

The embodiments of the disclosure further provide a display device, including the display substrate as described above. In addition, a structure of other parts of the display device may refer to the prior art, which is not described in detail here anymore. The display device may be a product or component having any display function such as an electronic paper, an Organic Light Emitting Diode (OLED) panel, a television, a display, a digital photo frame, a mobile phone or a tablet.

The GOA circuit of the disclosure will be described below in detail in conjunction with drawings and specific embodiments.

As shown in FIG. 1, the GOA unit according to the prior art includes a Reset signal output module Stage1 and a Gate signal output module Stage2. An input of a GOA unit in each row is an input of the Reset signal output module in the same row, and an output of the Reset signal output module is an input of the Gate signal output module in the same row and an input of a GOA unit in a next row. Furthermore, a GOA unit in the first row employs a STV signal as an input.

Figure 2:
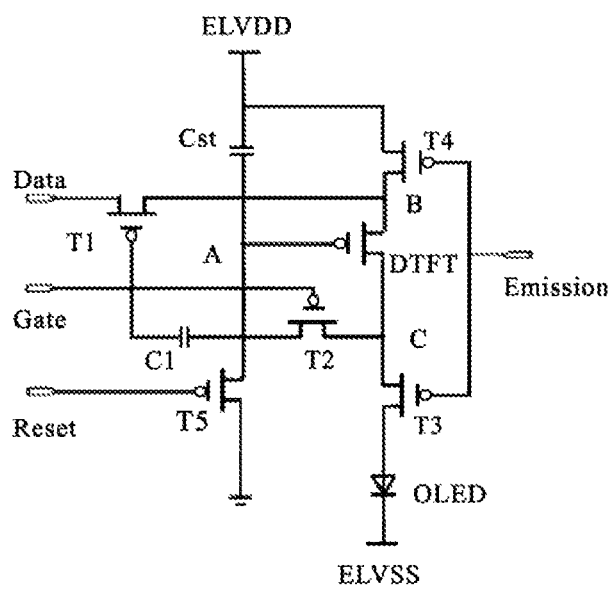
FIG. 2 is a schematic structural diagram of a pixel circuit.
Figure 3:
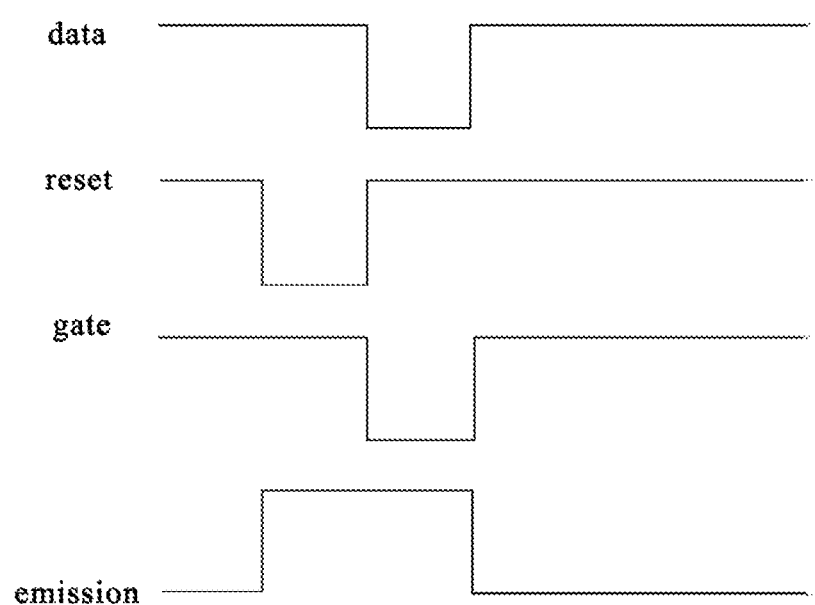
FIG. 3 is a schematic diagram of a time sequence of respective signals in the pixel circuit as shown in FIG. 2.

The GOA unit described above may be applied to an OLED display substrate, and corresponding pixel circuits are arranged in the OLED display substrate to receive a Gate signal and a Reset signal. As shown in FIG. 2 which is a schematic structural diagram of a pixel circuit in an embodiment, the pixel circuit includes a Gate signal input terminal and a Reset signal input terminal. FIG. 3 is a schematic diagram of a time sequence of respective signals in the pixel circuit.

When the VDD-GND is short-circuited due to some reasons within the AA region of the pixel circuit, an input voltage of the Reset signal and load variation will be influenced, so that an error occurs in the Reset signal in the row. Since the Reset signal in the row is an input of a GOA unit in a next row, the erroneous Reset signal will be passed down, resulting in a cascade reaction. Therefore, errors occur in a Reset signal and a Gate signal output from subsequent GOA units, and a gate multi-row output phenomenon of the GOA is generated, and a bright screen occurs in the pixel region after the VDD-GND is short-circuited.

In order to solve the problem described above and reduce the influence caused by the short circuit of the VDD-GND within the pixel region on the GOA circuit, the embodiments of the disclosure provide a GOA circuit in which a Gate signal output from a GOA unit in each row is an input of a GOA unit in a next row.

The GOA circuit according to the disclosure includes M cascaded GOA units, the M GOA units have a one-to-one correspondence with M rows of pixels within a pixel region, a Gate signal output from a GOA unit in an n-th row is an input signal of a GOA unit in an (n+1)-th row, and n is a natural number less than M. A GOA unit in the first row employs a STV signal as its input signal. A Reset signal output from the GOA unit in the n-th row is a Reset signal of pixels in the n-th row, a Gate signal output from the GOA unit in the (n+1)-th row is a Gate signal of pixels in the n-th row.

Figure 4:
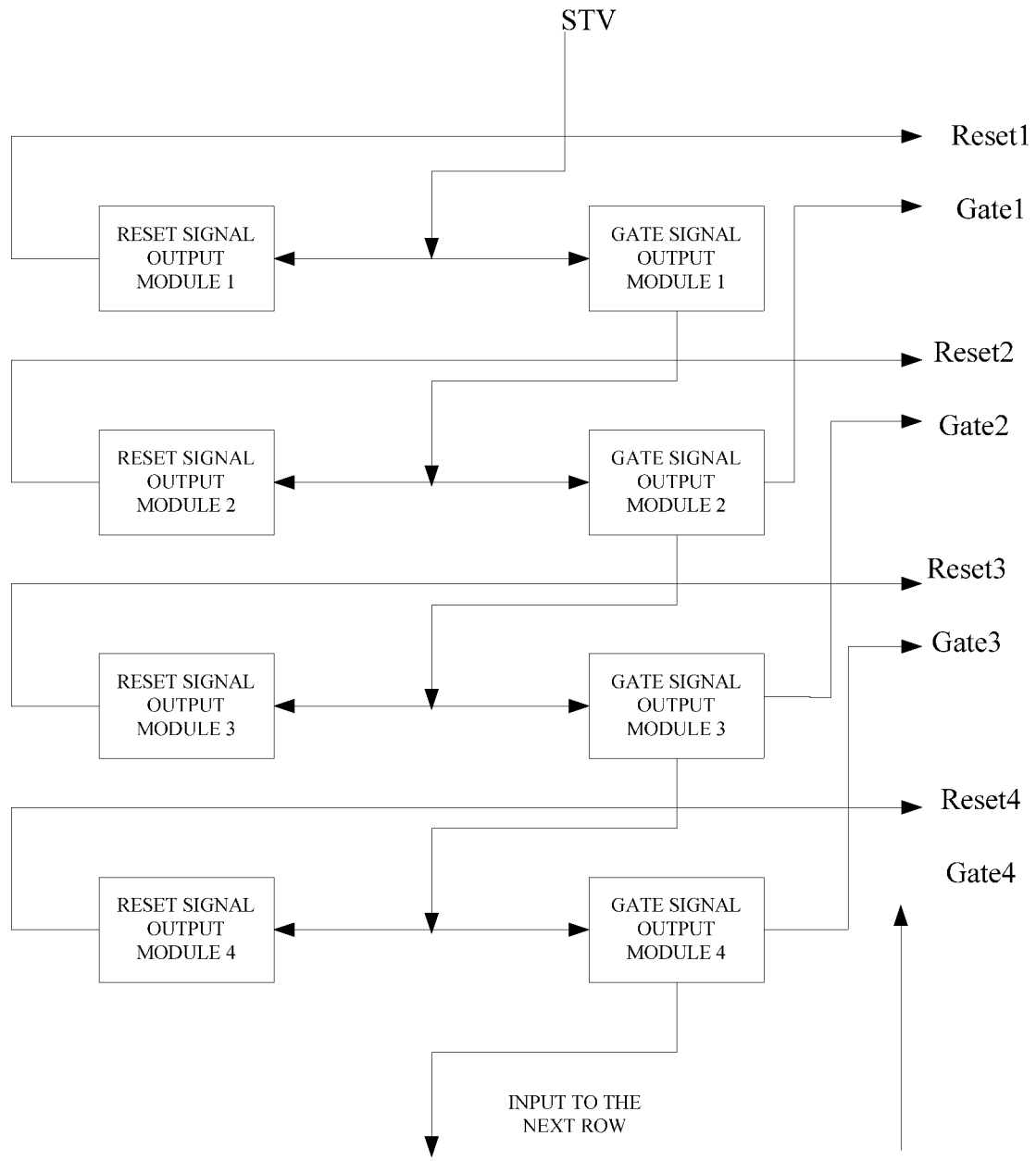
FIG. 4 is a schematic structural diagram of a GOA circuit according to the embodiments of the disclosure.

As shown in FIG. 4, a GOA unit in each row includes a Reset signal output module and a Gate signal output module. An input of the Reset signal output module and an input of the Gate signal output module are an input signal of the GOA unit, a Reset signal is output from the Reset signal output module, and a Gate signal is output from the Gate signal output module. Since the Gate signal output from a GOA unit in each row is an input signal of a GOA unit in a next row, the input signal of the Reset signal output module and the input signal of the Gate signal output module in each row is a Gate signal output from a Gate signal output module in a previous row.

Figure 5:
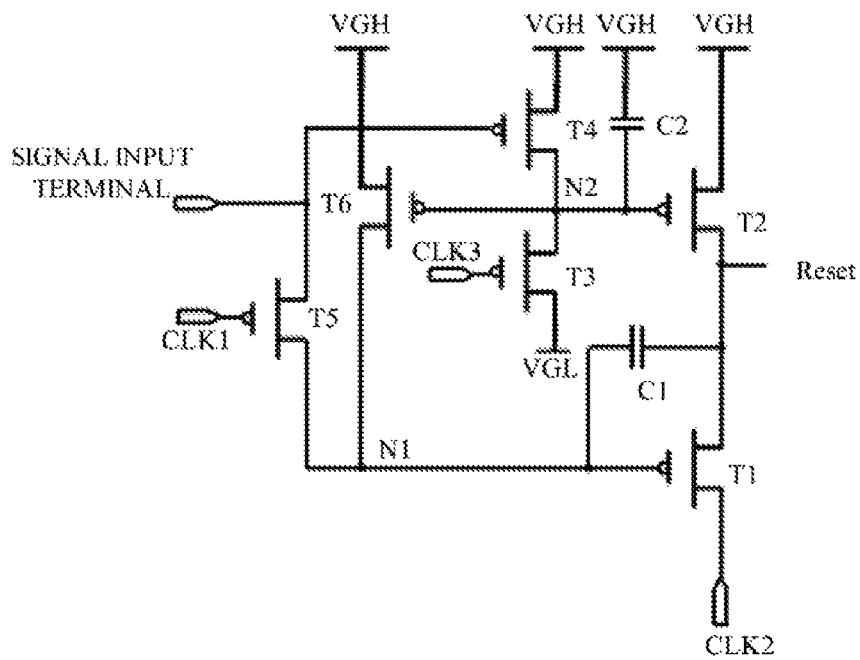
FIG. 5 is a schematic structural diagram of a Reset signal output module according to embodiments of the disclosure.

As shown in FIG. 5 which is a schematic structural diagram of a Reset signal output module, the Reset signal output module includes a first clock signal input terminal CLK1, a second clock signal input terminal CLK2, a third clock signal input terminal CLK3, a signal input terminal and a Reset signal output terminal. The Reset signal output module further includes a first thin film transistor T1, a second thin film transistor T2, a third thin film transistor T3, a fourth thin film transistor T4, a fifth thin film transistor T5 and a sixth thin film transistor T6.

As shown in FIG. 5, a gate electrode of T1 is connected to a drain electrode of T5, a source electrode of T1 is connected to the CLK2, a drain electrode of T1 is connected to the Reset signal output terminal so as to output the Reset signal to outside, a first capacitor is connected between the gate electrode and the drain electrode of T1.

A gate electrode of T2 is connected to a high level via a second capacitor, and the gate electrode of T2 is connected to a drain electrode of T3, a source electrode of T2 is connected to the high level, and a drain electrode of T2 is connected to the Reset signal output terminal so as to output the Reset signal to outside.

A gate electrode of T3 is connected to the CLK3, a source electrode of T3 is connected to a low level, and a drain electrode of T3 is connected to a drain electrode of T4.

A gate electrode of T4 is connected to the signal input terminal, a source electrode of T4 is connected to the high level, and a drain electrode of T4 is connected to the drain electrode of T3.

A gate electrode of T5 is connected to the CLK1, a source electrode of T5 is connected to the signal input terminal, a drain electrode of T5 is connected to the gate electrode of T1, and the drain electrode of T5 is connected to a drain electrode of T6.

A gate electrode of T6 is connected to the high level via a second capacitor, and the gate electrode of T6 is connected to the drain electrode of T3, a source electrode of T6 is connected to the high level, and a drain electrode of T6 is connected to the drain electrode of T5.

Figure 6:
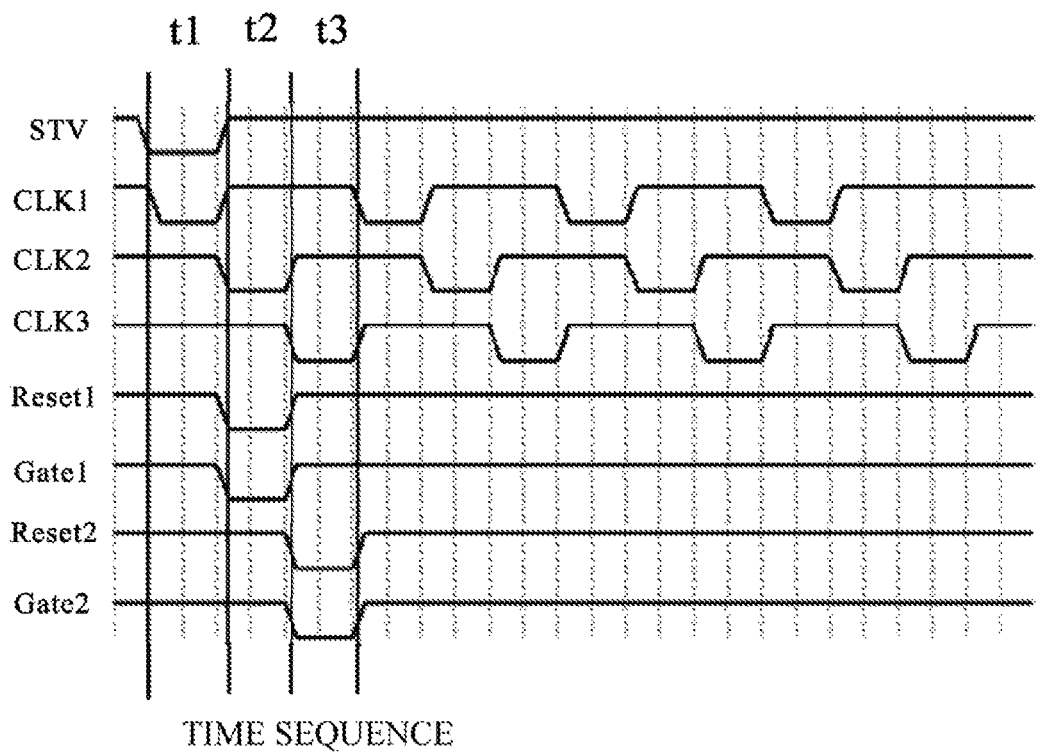
FIG. 6 is a schematic diagram of a time sequence of each signal in the embodiments of the disclosure.

The Reset signal output from the Reset signal output module is triggered by the three clock signals, i.e., CLK1, CLK2 and CLK3, simultaneously. The STV signal as an input signal of the GOA unit in the first row is input to the Reset signal output module 1. A schematic diagram of a time sequence is shown in FIG. 6, within t1, STV is a low level, CLK1 is a low level, and T5, T4 and T1 are switched on. At the moment, CLK2 is a high level, and the Reset signal output from the Reset signal output terminal 1 is a high level. Within t2, since a capacitor. C1 works and T1 is switched on, and the CLK2 is a low level at the moment, and the Reset1 signal output from the Reset signal output module 1 is a low level. Within t3, T3, T2 and T6 are switched on, and the signal Reset1 output from the Reset signal output terminal 1 is a high level. Specifically, VGH is a high level, VGL is a low level. The signal Reset1 is connected to the Reset signal input terminal of the pixels in the first row, the signal Reset2 is connected to the Reset signal input terminal of the pixels in the second row, and so on.

Specifically, the Gate signal output terminal includes a first clock signal input terminal CLK1, a second clock signal input terminal CLK2, a third clock signal input terminal CLK3, a signal input terminal and a Gate signal output terminal. The Gate signal output module further includes a seventh thin film transistor, an eighth thin film transistor, a ninth thin film transistor, a tenth thin film transistor, an eleventh thin film transistor and a twelfth thin film transistor.

Specifically, a gate electrode of the seventh thin film transistor is connected to the CLK1, a source electrode of the seventh thin film transistor is connected to the CLK2, a drain electrode of the seventh thin film transistor is connected to the Gate signal output terminal so as to output a Gate signal to outside.

A gate electrode of the eighth thin film transistor is connected to the CLK1, a source electrode of the eighth thin film transistor is connected to the Gate signal output terminal, and a drain electrode of the eighth thin film transistor is connected to the CLK2.

A gate electrode of the ninth thin film transistor is connected to the CLK1, a source electrode of the ninth thin film transistor is connected to the Gate signal output terminal, and a drain electrode of the ninth thin film transistor is connected to the CLK2.

A gate electrode of the tenth thin film transistor is connected to the CLK1, a source electrode of the tenth thin film transistor is connected to the Gate signal output terminal, and a drain electrode of the tenth thin film transistor is connected to the CLK2.

A gate electrode of the eleventh thin film transistor is connected to the CLK1, a source electrode of the eleventh thin film transistor is connected to the Gate signal output terminal, and a drain electrode of the eleventh thin film transistor is connected to the CLK2.

A gate electrode of the twelfth thin film transistor is connected to the CLK1, a source electrode of the twelfth thin film transistor is connected to the Gate signal output terminal, and a drain electrode of the twelfth thin film transistor is connected to the CLK2.

The Gate signal output from the Gate signal output module are triggered by three clock signal, i.e., CLK1, CLK2 and CLK3, simultaneously. The STV signal as an input signal of a GOA unit in the first row is input to the Gate signal output module 1. A schematic diagram of a time sequence is shown in FIG. 6, within t1, STV is a low level, CLK1 is a low level, the eleventh thin film transistor, the tenth thin film transistor and the seventh thin film transistor are switched on. At the moment, CLK2 is a high level, the signal Gate1 output from the Gate signal output module 1 is a high level. Within t2, since capacitor. C1 works and the seventh thin film transistor is switched on, then CLK2 is a low level at the moment, and the signal Gate1 output from the Gate signal output module 1 is a low level. Within t3, the ninth thin film transistor, the eighth thin film transistor and the twelfth thin film transistor are switched on, the signal Gate1 output from the Gate signal output module 1 is a high level. Specifically, VGH is a high level, VGL is a low level. The signal Gate1 is the input of the Reset signal output module 2 and the input of the Gate signal output module 2 in the second row. The signal Gate2 is connected to the Gate signal input terminal of the pixels in the first row, and is an input of the Reset signal output module 3 and an input of the Gate signal output module 3 in the third row. The signal Gate3 is connected to the Gate signal input terminal of the pixels in the second row, and is an input of the Reset signal output module 4 and an input of the Gate signal output module 4 in the fourth row, and so on.

The technical solutions of the disclosure is suitable for any GOA circuit structure including two-stage output (two-stage output, i.e., Reset and Gate), for example a structure such as a common 12T4C and 10T4C. In the disclosure, the layout structure of the GOA circuit is changed, a Gate signal output from the GOA unit in each row is an input signal of the GOA unit in a next row. In this way, a Reset signal output from the GOA unit in each row is no more the input signal of the GOA unit in a next row. Even though an error occurs in the Reset signal output from a GOA unit in a certain row due to the short circuit of the VDD-GND within the pixel region, an output of a GOA unit in a next row will not be influenced, which reduces the influence of the short circuit of the VDD-GND on the output of the GOA circuit. In addition, since a Gate signal output from the Gate signal output module in a previous row is an input signal of the Gate signal output module in a next row, a drive capacity of the two-stage Gate signal is greater than that of a one-stage Gate signal, which enables signal transmission capacity of the GOA circuit to be enhanced.

The foregoing is the preferred embodiments of the disclosure. It should be indicated that, for those skilled in the art, several improvements and modifications may also be made without departing from the spirit described by the disclosure, which are regarded as within the scope of protection of the disclosure.

What is claimed is:

1. A Gate Driver on Array (GOA) circuit comprising M cascaded GOA units, wherein:
   the M cascaded GOA units have a one-to-one correspondence with M rows of pixels within a pixel region,
   a first GOA unit of the M cascaded GOA units corresponds to an n-th row of the M rows of pixels,
   n is a natural number less than M,
   a second GOA unit of the M cascaded GOA units corresponds to an (n+1)-th row of the M rows of pixels,
   each of the M cascaded GOA units outputs a Gate signal and a Reset signal,
   the second GOA unit comprises: (i) a Reset signal output module configured to receive a Reset input signal and output the Reset signal and (ii) a Gate signal output module configured to receive a Gate input signal and output the Gate signal,
   the Gate signal output from the first GOA unit is connected as the Reset input signal of the second GOA unit and the Gate input signal of the second GOA unit,
   the Reset signal output module includes (i) a first clock signal input terminal CLK1, (ii) a second clock signal input terminal CLK2, (iii) a third clock signal input terminal CLK3, (iv) a signal input terminal, (v) a Reset signal output terminal, (vi) a first thin film transistor, (vii) a second thin film transistor, (viii) a third thin film transistor, (ix) a fourth thin film transistor, (x) a fifth thin film transistor, and (xi) a sixth thin film transistor,
   a gate electrode of the first thin film transistor is connected to a drain electrode of the fifth thin film transistor, a source electrode of the first thin film transistor is connected to the CLK2, and a drain electrode of the first thin film transistor is connected to the Reset signal output terminal so as to output the Reset signal to outside, and a first capacitor is connected between the gate electrode and the drain electrode of the first thin film transistor,
   a gate electrode of the second thin film transistor is connected to a high level via a second capacitor, the gate electrode of the second thin film transistor is connected to a drain electrode of the third thin film transistor, a source electrode of the second thin film transistor is connected to the high level, and a drain electrode of the second thin film transistor is connected to the Reset signal output terminal so as to output the Reset signal to outside,
   a gate electrode of the third thin film transistor is connected to the CLK3, a source electrode of the third thin film transistor is connected to a low level, and a drain electrode of the third thin film transistor is connected to a drain electrode of the fourth thin film transistor,
   a gate electrode of the fourth thin film transistor is connected to the signal input terminal, a source electrode of the fourth thin film transistor is connected to the high level, and the drain electrode of the fourth thin film transistor is connected to the drain electrode of the third thin film transistor,
   a gate electrode of the fifth thin film transistor is connected to the CLK1, a source electrode of the fifth thin film transistor is connected to the signal input terminal, a drain electrode of the fifth thin film transistor is connected to the gate electrode of the first thin film transistor, and the drain electrode of the fifth thin film transistor is connected to a drain electrode of the sixth thin film transistor, and
   a gate electrode of the sixth thin film transistor is connected to the high level via the second capacitor, the gate electrode of the sixth thin film transistor is connected to the drain electrode of the third thin film transistor, a source electrode of the sixth thin film transistor is connected to the high level, and the drain electrode of the sixth thin film transistor is connected to the drain electrode of the fifth thin film transistor.

2. The GOA circuit according to claim 1, wherein:
   the first GOA unit corresponds to a first row of the M rows of pixels, and
   an input signal of the first GOA unit is a Start Vertical (STV) signal.

3. The GOA circuit according to claim 1, wherein:
   the Reset signal output from the first GOA unit is connected to an input terminal of a pixel Reset signal of a pixel in the n-th row, and
   the Gate signal output from the second GOA unit is connected to an input terminal of a pixel Gate signal of the pixel in the n-th row.

4. The GOA circuit according to claim 1, wherein:
   the Gate signal output module of the second GOA unit comprises: (i) a first clock signal input terminal CLK1, (ii) a second clock signal input terminal CLK2, (iii) a third clock signal input terminal CLK3, (iv) a signal input terminal, (v) a Gate signal output terminal, (vi) a seventh thin film transistor, (vii) an eighth thin film transistor, (viii) a ninth thin film transistor, (ix) a tenth thin film transistor, (x) an eleventh thin film transistor, and (xi) a twelfth thin film transistor;
   a gate electrode of the seventh thin film transistor is connected to the CLK1 of the Gate signal output module, a source electrode of the seventh thin film transistor is connected to the CLK2 of the Gate signal output module, and a drain electrode of the seventh thin film transistor is connected to the Gate signal output terminal so as to output the Gate signal to outside;

a gate electrode of the eighth thin film transistor is connected to the CLK1 of the Gate signal output module, a source electrode of the eighth thin film transistor is connected to the Gate signal output terminal, and a drain electrode of the eighth thin film transistor is connected to the CLK2 of the Gate signal output module;

a gate electrode of the ninth thin film transistor is connected to the CLK1 of the Gate signal output module, a source electrode of the ninth thin film transistor is connected to the Gate signal output terminal, and a drain electrode of the ninth thin film transistor is connected to the CLK2 of the Gate signal output module;

a gate electrode of the tenth thin film transistor is connected to the CLK1 of the Gate signal output module, a source electrode of the tenth thin film transistor is connected to the Gate signal output terminal, and a drain electrode of the tenth thin film transistor is connected to the CLK2 of the Gate signal output module;

a gate electrode of the eleventh thin film transistor is connected to the CLK1 of the Gate signal output module, a source electrode of the eleventh thin film transistor is connected to the Gate signal output terminal, and a drain electrode of the eleventh thin film transistor is connected to the CLK2 of the Gate signal output module; and a gate electrode of the twelfth thin film transistor is connected to the CLK1 of the Gate signal output module, a source electrode of the twelfth thin film transistor is connected to the Gate signal output terminal, and a drain electrode of the twelfth thin film transistor is connected to the CLK2 of the Gate signal output module.

5. A display substrate on which a Gate Driver on Array (GOA) circuit and M rows of pixels in a pixel region are integrated, wherein:

the GOA circuit comprises M cascaded GOA units, the M cascaded GOA units have a one-to-one correspondence with M rows of pixels, a first GOA unit of the M cascaded GOA units corresponds to an n-th row of the M rows of pixels, n is a natural number less than M, a second GOA unit of the M cascaded GOA units corresponds to an (n+1)-th row of the M rows of pixels, each of the M cascaded GOA units outputs a Gate signal and a Reset signal, the second GOA unit comprises: (i) a Reset signal output module configured to receive a Reset input signal and output the Reset signal and (ii) a Gate signal output module configured to receive a Gate input signal and output the Gate signal, the Gate signal output from the first GOA unit is connected as the Reset input signal of the second GOA unit and the Gate input signal of the second GOA unit, the Reset signal output module includes: (i) a first clock signal input terminal CLK1, (ii) a second clock signal input terminal CLK2, (iii) a third clock signal input terminal CLK3, (iv) a signal input terminal, (v) a Reset signal output terminal, (vi) a first thin film transistor, (vii) a second thin film transistor, (viii) a third thin film transistor, (ix) a fourth thin film transistor, (x) a fifth thin film transistor, and (xi) a sixth thin transistor, a gate electrode of the first thin film transistor is connected to a drain electrode of the fifth thin film transistor, a source electrode of the first thin film transistor is connected to the CLK2, and a drain electrode of the first thin film transistor is connected to the Reset signal output terminal so as to output the Reset signal to outside, and a first capacitor is connected between the gate electrode and the drain electrode of the first thin film transistor, a gate electrode of the second thin film transistor is connected to a high level via a second capacitor, and the gate electrode of the second thin film transistor is connected to a drain electrode of the third thin film transistor, a source electrode of the second thin film transistor is connected to the high level, and a drain electrode of the second thin film transistor is connected to the Reset signal output terminal so as to output the Reset signal to outside, a gate electrode of the third thin film transistor is connected to the CLK3, a source electrode of the third thin film transistor is connected to a low level, and the drain electrode of the third thin film transistor is connected to a drain electrode of the fourth thin film transistor, a gate electrode of the fourth thin film transistor is connected to the signal input terminal, a source electrode of the fourth thin film transistor is connected to the high level, and the drain electrode of the fourth thin film transistor is connected to the drain electrode of the third thin film transistor, a gate electrode of the fifth thin film transistor is connected to the CLK1, a source electrode of the fifth thin film transistor is connected to the signal input terminal, a drain electrode of the fifth thin film transistor is connected to the gate electrode of the first thin film transistor, and the drain electrode of the fifth thin film transistor is connected to a drain electrode of the sixth thin film transistor, and a gate electrode of the sixth thin film transistor is connected to the high level via the second capacitor, the gate electrode of the sixth thin film transistor is connected to the drain electrode of the third thin film transistor, a source electrode of the sixth thin film transistor is connected to the high level, and the drain electrode of the sixth thin film transistor is connected to the drain electrode of the fifth thin film transistor.

6. The display substrate according to claim 5, wherein:

the first GOA unit corresponds to a first row of the M rows of pixels, and an input signal of the first GOA unit is a Start Vertical (STV) signal.

7. The display substrate according to claim 5, wherein:

the Reset signal output from the first GOA unit is connected to an input terminal of a pixel Reset signal of a pixel in the n-th row, and the Gate signal output from the second GOA unit is connected to an input terminal of a pixel Gate signal of the pixel in the n-th row.

8. The display substrate according to claim 5, wherein:

the Gate signal output module of the second GOA unit comprises: (i) a first clock signal input terminal CLK1, (ii) a second clock signal input terminal CLK2, (iii) a third clock signal input terminal CLK3, (iv) a signal input terminal, (v) a Gate signal output terminal, (vi) a seventh thin film transistor, (vii) an eighth thin film transistor, (viii) a ninth thin film transistor, (ix) a tenth thin film transistor, (x) an eleventh thin film transistor, and (xi) a twelfth thin film transistor;

a gate electrode of the seventh thin film transistor is connected to the CLK1 of the Gate signal output module, a source electrode of the seventh thin film transistor is connected to the CLK2 of the Gate signal output module, and a drain electrode of the seventh thin film transistor is connected to the Gate signal output terminal so as to output the Gate signal to outside;

a gate electrode of the eighth thin film transistor is connected to the CLK1 of the Gate signal output module, a source electrode of the eighth thin film transistor is connected to the Gate signal output terminal, and a drain electrode of the eighth thin film transistor is connected to the CLK2 of the Gate signal output module;

a gate electrode of the ninth thin film transistor is connected to the CLK1 of the Gate signal output module, a source electrode of the ninth thin film transistor is connected to the Gate signal output terminal, and a drain electrode of the ninth thin film transistor is connected to the CLK2 of the Gate signal output module;

a gate electrode of the tenth thin film transistor is connected to the CLK1 of the Gate signal output module, a source electrode of the tenth thin film transistor is connected to the Gate signal output terminal, and a drain electrode of the tenth thin film transistor is connected to the CLK2 of the Gate signal output module;

a gate electrode of the eleventh thin film transistor is connected to the CLK1 of the Gate signal output module, a source electrode of the eleventh thin film transistor is connected to the Gate signal output terminal, and a drain electrode of the eleventh thin film transistor is connected to the CLK2 of the Gate signal output module; and a gate electrode of the twelfth thin film transistor is connected to the CLK1 of the Gate signal output module, a source electrode of the twelfth thin film transistor is connected to the Gate signal output terminal, and a drain electrode of the twelfth thin film transistor is connected to the CLK2 of the Gate signal output module.

9. A display device comprising a display substrate, wherein:

a Gate Driver on Array (GOA) circuit and M rows of pixels in a pixel region are integrated on the display substrate, the GOA circuit comprises M cascaded GOA units, the M cascaded GOA units have a one-to-one correspondence with M rows of pixels in the pixel region, a first GOA unit of the M cascaded GOA units corresponds to an n-th row of the M rows of pixels, n is a natural number less than M, a second GOA unit of the M cascaded GOA units corresponds to an (n+1)-th row of the M rows of pixels, each of the M cascaded GOA units outputs a Gate signal and a Reset signal, the second GOA unit comprises: (i) a Reset signal output module configured to receive a Reset input signal and output the Reset signal and (ii) a Gate signal output module configured to receive a Gate input signal and output the Gate signal, the Gate signal output from the first GOA unit is connected as the Reset input signal of the second GOA unit and the Gate input signal of the second GOA unit, the Reset signal output module includes (i) a first clock signal input terminal CLK1, (ii) a second clock signal input terminal CLK2, (iii) a third clock signal input terminal CLK3, (iv) a signal input terminal, (v) a Reset signal output terminal, (vi) a first thin film transistor, (vii) a second thin film transistor, (viii) a third thin film transistor, (ix) a fourth thin film transistor, (x) a fifth thin film transistor, and (xi) a sixth thin film transistor, a gate electrode of the first thin film transistor is connected to a drain electrode of the fifth thin film transistor, a source electrode of the first thin film transistor is connected to the CLK2, and a drain electrode of the first thin film transistor is connected to the Reset signal output terminal so as to output the Reset signal to outside, and a first capacitor is connected between the gate electrode and the drain electrode of the first thin film transistor, a gate electrode of the second thin film transistor is connected to a high level via a second capacitor, the gate electrode of the second thin film transistor is connected to a drain electrode of the third thin film transistor, a source electrode of the second thin film transistor is connected to the high level, and a drain electrode of the second thin film transistor is connected to the Reset signal output terminal so as to output the Reset signal to outside, a gate electrode of the third thin film transistor is connected to the CLK3, a source electrode of the third thin film transistor is connected to a low level, and a drain electrode of the third thin film transistor is connected to a drain electrode of the fourth thin film transistor, a gate electrode of the fourth thin film transistor is connected to the signal input terminal, a source electrode of the fourth thin film transistor is connected to the high level, and the drain electrode of the fourth thin film transistor is connected to the drain electrode of the third thin film transistor, a gate electrode of the fifth thin film transistor is connected to the CLK1, a source electrode of the fifth thin film transistor is connected to the signal input terminal, a drain electrode of the fifth thin film transistor is connected to the gate electrode of the first thin film transistor, and the drain electrode of the fifth thin film transistor is connected to a drain electrode of the sixth thin film transistor, and a gate electrode of the sixth thin film transistor is connected to the high level via the second capacitor, the gate electrode of the sixth thin film transistor is connected to the drain electrode of the third thin film transistor, a source electrode of the sixth thin film transistor is connected to the high level, and the drain electrode of the sixth thin film transistor is connected to the drain electrode of the fifth thin film transistor.

10. The display device according to claim 9, wherein:

the first GOA unit corresponds to a first row of the M rows of pixels, and an input signal of the first GOA unit is a Start Vertical (STV) signal.

11. The display device according to claim 10, wherein:

the Reset signal output from the first GOA unit is connected to an input terminal of a pixel Reset signal of a pixel in the n-th row, and the Gate signal output from the second GOA unit is connected to an input terminal of a pixel Gate signal of the pixel in the n-th row.

12. The display device according to claim 9, wherein:

the Reset signal output from the first GOA unit is connected to an input terminal of a pixel Reset signal of a pixel in the n-th row, and the Gate signal output from the second GOA unit is connected to an input terminal of a pixel Gate signal of the pixel in the n-th row.

13. The display device according to claim 9, wherein:

the Gate signal output module of the second GOA unit comprises: (i) a first clock signal input terminal CLK1, (ii) second clock signal input terminal CLK2, (iii) a third clock signal input terminal CLK3, (iv) a signal input terminal, (v) a Gate signal output terminal, (vi) a seventh thin film transistor, (vii) an eighth thin film transistor, (viii) a ninth thin film transistor, (ix) a tenth thin film transistor, (x) an eleventh thin film transistor, and (xi) a twelfth thin film transistor;

a gate electrode of the seventh thin film transistor is connected to the CLK1 of the Gate signal output module, a source electrode of the seventh thin film transistor is connected to the CLK2 of the Gate signal output module, and a drain electrode of the seventh thin film transistor is connected to the Gate signal output terminal to output the Gate signal to outside;

a gate electrode of the eighth thin film transistor is connected to the CLK1 of the Gate signal output module, a source electrode of the eighth thin film transistor is connected to the Gate signal output terminal, and a drain electrode of the eighth thin film transistor is connected to the CLK2 of the Gate signal output module;

a gate electrode of the ninth thin film transistor is connected to the CLK1 of the Gate signal output module, a source electrode of the ninth thin film transistor is connected to the Gate signal output terminal, and a drain electrode of the ninth thin film transistor is connected to the CLK2 of the Gate signal output module;

a gate electrode of the tenth thin film transistor is connected to the CLK1 of the Gate signal output module, a source electrode of the tenth thin film transistor is connected to the Gate signal output terminal, and a drain electrode of the tenth thin film transistor is connected to the CLK2 of the Gate signal output module;

a gate electrode of the eleventh thin film transistor is connected to the CLK1 of the Gate signal output module, a source electrode of the eleventh thin film transistor is connected to the Gate signal output terminal, and a drain electrode of the eleventh thin film transistor is connected to the CLK2 of the Gate signal output module; and a gate electrode of the twelfth thin film transistor is connected to the CLK1 of the Gate signal output module, a source electrode of the twelfth thin film transistor is connected to the Gate signal output terminal, and a drain electrode of the twelfth thin film transistor is connected to the CLK2 of the Gate signal output module.

14. The display device according to claim 9, wherein the display device is an electronic paper, an Organic Light Emitting Diode (OLED) panel, a television, a display, a digital photo frame, a mobile phone or a tablet.

\* \* \* \* \*